United States Patent
Shvydun

(10) Patent No.: US 10,651,874 B2
(45) Date of Patent: May 12, 2020

(54) RECONFIGURABLE FEC

(71) Applicant: INPHI CORPORATION, Santa Clara, CA (US)

(72) Inventor: Volodymyr Shvydun, Los Altos, CA (US)

(73) Assignee: INPHI CORPORATION, Santa Clara, CA (US)

( * ) Notice: Subject to any disclaimer, the term of this patent is extended or adjusted under 35 U.S.C. 154(b) by 0 days.

(21) Appl. No.: 16/192,659

(22) Filed: Nov. 15, 2018

(65) Prior Publication Data

US 2019/0089385 A1    Mar. 21, 2019

Related U.S. Application Data

(63) Continuation of application No. 15/283,024, filed on Sep. 30, 2016, now Pat. No. 10,158,379, which is a continuation of application No. 14/602,185, filed on Jan. 21, 2015, now Pat. No. 9,484,960.

(51) Int. Cl.
*H04L 1/00* (2006.01)
*H03M 13/00* (2006.01)
*H04B 10/60* (2013.01)
*H03M 13/15* (2006.01)

(52) U.S. Cl.
CPC ....... *H03M 13/617* (2013.01); *H03M 13/153* (2013.01); *H03M 13/159* (2013.01); *H03M 13/1545* (2013.01); *H04B 10/60* (2013.01); *H04L 1/0045* (2013.01); *H03M 13/152* (2013.01); *H03M 13/1515* (2013.01)

(58) Field of Classification Search
CPC .................................................... H04L 1/0057

USPC .......................................... 714/776, 774, 788
See application file for complete search history.

(56) References Cited

U.S. PATENT DOCUMENTS

| | | |
|---|---|---|
| 5,592,612 A | 1/1997 | Birk |
| 6,128,094 A | 10/2000 | Smith |
| 6,400,621 B2 | 6/2002 | Hidaka et al. |
| 6,542,956 B1 | 4/2003 | Lee et al. |
| 6,993,701 B2 | 1/2006 | Corbett et al. |
| 7,656,727 B2 | 2/2010 | Thayer |
| 7,990,746 B2 | 8/2011 | Rajan |

(Continued)

OTHER PUBLICATIONS

Notice of Allowance for U.S. Appl. No. 13/558,332, dated Feb. 25, 2014.

(Continued)

*Primary Examiner* — Fritz Alphonse
(74) *Attorney, Agent, or Firm* — Richard T. Ogawa; Ogawa P.C.

(57) ABSTRACT

The present invention is directed to data communication systems and methods thereof. According to various embodiments, the present invention provides a communication with a reconfigurable forward-error-correction (FEC) module. The FEC module processes data received from two or more communication lanes, and depending on the mode of operation, the FEC module can combine data from the two or more communication lanes and perform error correction on the combined data, or the FEC module can processes data from the two communications lanes separately and perform error correction independently for the each of the data communication lanes. There are other embodiments as well.

20 Claims, 7 Drawing Sheets

(56) References Cited

U.S. PATENT DOCUMENTS

| | | |
|---|---|---|
| 8,325,554 B2 | 12/2012 | Sweere et al. |
| 8,687,451 B2 | 4/2014 | Wang |
| 2004/0123029 A1 | 6/2004 | Dalal et al. |
| 2006/0200697 A1 | 9/2006 | Ito |
| 2008/0104290 A1 | 5/2008 | Cowell et al. |
| 2008/0183959 A1 | 7/2008 | Pelley et al. |
| 2009/0070656 A1* | 3/2009 | Jo ................. G06F 11/1068 714/763 |
| 2009/0141558 A1 | 6/2009 | Sarin et al. |
| 2009/0150751 A1* | 6/2009 | Jo ................. G06F 11/1068 714/763 |
| 2009/0217140 A1* | 8/2009 | Jo ................. G06F 11/1068 714/785 |
| 2009/0259921 A1* | 10/2009 | Chang ............. H03M 13/153 714/782 |
| 2009/0300259 A1 | 12/2009 | Luo et al. |
| 2010/0005212 A1 | 1/2010 | Gower et al. |
| 2010/0162037 A1 | 6/2010 | Maule et al. |
| 2010/0199125 A1 | 8/2010 | Reche |
| 2010/0274952 A1 | 10/2010 | Lee |
| 2011/0072200 A1 | 3/2011 | Lee et al. |
| 2011/0125990 A1 | 5/2011 | Khosravi et al. |
| 2011/0170329 A1 | 7/2011 | Kang |
| 2012/0151294 A1 | 6/2012 | Yoo et al. |
| 2012/0243299 A1 | 9/2012 | Shau |
| 2012/0257459 A1 | 10/2012 | Berke |
| 2012/0297231 A1 | 11/2012 | Qawami et al. |
| 2013/0060996 A1 | 3/2013 | Berke |
| 2014/0115192 A1* | 4/2014 | Hunkins ............. G06F 13/24 710/8 |

OTHER PUBLICATIONS

Office Action for U.S. Appl. No. 13/620,288, dated Oct. 1, 2013.
Office Action for U.S. Appl. No. 13/791,814, dated May 1, 2014.
Office Action for U.S. Appl. No. 13/619,692, dated May 14, 2014.
Office Action for U.S. Appl. No. 13/620,288, dated May 16, 2014.
Office Action for U.S. Appl. No. 13/791,807, dated May 29, 2014.
Office Action for U.S. Appl. No. 14/178,241, dated Jun. 27, 2014.
Office Action for U.S. Appl. No. 13/653,373, dated Mar. 27, 2014.

* cited by examiner

RECONFIGURABLE FEC

CROSS-REFERENCES TO RELATED APPLICATIONS

The present application is a continuation of and claims priority to U.S. application Ser. No. 15/283,024 filed Sep. 30, 2016, which is a continuation of U.S. application Ser. No. 14/602,185 filed Jan. 21, 2015, now U.S. Pat. No. 9,484,960 issued Nov. 1, 2016, the contents of which are incorporated by reference herein for all purposes.

STATEMENT AS TO RIGHTS TO INVENTIONS MADE UNDER FEDERALLY SPONSORED RESEARCH AND DEVELOPMENT

NOT APPLICABLE

N/A

NOT APPLICABLE

BACKGROUND OF THE INVENTION

The present invention is directed to data communication system and methods.

Over the last few decades, the use of communication networks exploded. In the early days Internet, popular applications were limited to emails, bulletin board, and mostly informational and text-based web page surfing, and the amount of data transferred was usually relatively small. Today, Internet and mobile applications demand a huge amount of bandwidth for transferring photo, video, music, and other multimedia files. For example, a social network like Facebook processes more than 500 TB of data daily. With such high demands on data and data transfer, existing data communication systems need to be improved to address these needs.

Over the past, there have been many types of communication systems and methods. Unfortunately, they have been inadequate for various applications. Therefore, improved communication systems and methods are desired.

BRIEF SUMMARY OF THE INVENTION

The present invention is directed to data communication systems and methods thereof. According to various embodiments, the present invention provides a communication with a reconfigurable forward-error-correction (FEC) module. The FEC module processes data received from two or more communication lanes, and depending on the mode of operation, the FEC module can combine data from the two or more communication lanes and perform error correction on the combined data, or the FEC module can processes data from the two communications lanes separately and perform error correction independently for the each of the data communication lanes. There are other embodiments as well.

According to an embodiment, the present invention provides a communication system, which includes a receiving module that is connected to a plurality of communication lanes. The plurality of communication lanes includes a first communication lane and a second communication. The first communication land and the second communication lane operate at n-bit. The system also includes a forward error correction module comprising. The forward error correction module includes a syndrome computation (SC) module. The SC module includes a plurality of processing modules. The plurality of processing modules includes a first processing module and a second processing module. The first processing module is configured to operate in an n-bit mode and a 2n-bit mode for calculating syndrome polynomials for at least a first equation. The first processing module performs syndrome calculation using an n-bit vector based on data received from the first communication lane when operating in the n-bit mode. The first processing module performs syndrome calculation using a 2n-bit vector based on data received from the first communication lane and the second communication lane when operating in the 2n-bit mode. The forward error correction module also includes a key equation solver (KES) module coupled to the SC module. The KES module is configured to generate at least a first polynomial and a second polynomial based using at least the first equation. The forward error correction module further includes a Chien search (CS) module coupled to the KES module. The forward error correction module further includes a buffer module.

According to another embodiment, the present invention provides a communication system. The system includes a receiving module that is connected to a plurality of communication lanes. The plurality of communication lanes includes a first communication lane and a second communication. The first communication land and the second communication lane operate at n-bit. The system also includes a plurality of accumulators corresponding to the plurality of communication lanes. The plurality of accumulators is configured to align data received from the plurality of communication lanes. The system also includes a forward error correction (FEC) module, which includes a syndrome computation (SC) module. The SC module includes a plurality of processing modules. The plurality of processing modules includes a first processing module and a second processing module. The first processing module is configured to operate in an n-bit mode and a 2n-bit mode for calculating syndrome polynomials for at least a first equation. The first processing module performs syndrome calculation using an n-bit vector based on data received from the first communication lane when operating in the n-bit mode. The first processing module performs syndrome calculation using a 2n-bit vector based on data received from the first communication lane and the second communication lane when operating in the 2n-bit mode. The forward error correction module also includes a key equation solver (KES) module coupled to the SC module. The KES module is configured to generate at least a first polynomial and a second polynomial based using at least the first equation. The forward error correction module also includes a Chien search (CS) module coupled to the KES module. The forward error correction module additionally includes a buffer module comprising a plurality of buffers corresponding to the plurality of communication lanes.

According to another embodiment, the present invention provides a communication system. The system includes a receiving module that is connected to a plurality of communication lanes. The plurality of communication lanes includes a first communication lane and a second communication. The first communication land and the second communication lane operate at n-bit. The system also includes a forward error correction module, which includes a syndrome computation (SC) module. The SC module comprises a plurality of processing modules. The plurality of processing modules includes a first processing module and a second processing module. The first processing module is configured to operate in an n-bit mode and a 2n-bit mode for calculating syndrome polynomials for at least a first equation. The first processing module performs syndrome calculation using an n-bit vector based on data received from the first communication lane when operating in the n-bit mode. The first processing module performs syndrome calculation using a 2n-bit vector based on data received from the first communication lane and the second communication lane when operating in the 2n-bit mode. The forward error correction module further includes a key equation solver (KES) module coupled to the SC module. The KES module is configured to generate at least a first polynomial and a second polynomial based using at least the first equation. The forward error correction module additionally includes a Chien search (CS) module coupled to the KES module. The CS module comprises a plurality of sections. The plurality of sections including a first section and a second section. The first section is configured to operate in an n-bit mode and a 2n-bit mode for determining errors. The forward error correction module also includes a buffer.

It is to be appreciated that embodiments of the present invention provide many advantages over conventional systems and methods thereof. By making FEC modules reconfigurable, as described below, a communication system can operate at different modes and speeds without extra hardware. More specifically, instead of having multiple FEC modules that are configured for different communication modes (e.g., single communication lane, double communication lanes, quadruple communication lanes, etc.), a single FEC modules can operate in multiple mode without redundant hardware, which saves both space and costs. Additionally, the embodiments of the present invention are compatible with existing and future devices and processes. For example, the reconfigurable FEC modules can be used in existing data communication systems. Furthermore, embodiments of the present invention can be used for high-speed applications, such as communication, computing, and/or other types of applications. There are other benefits as well.

DETAILED DESCRIPTION OF THE INVENTION

Figure 1:
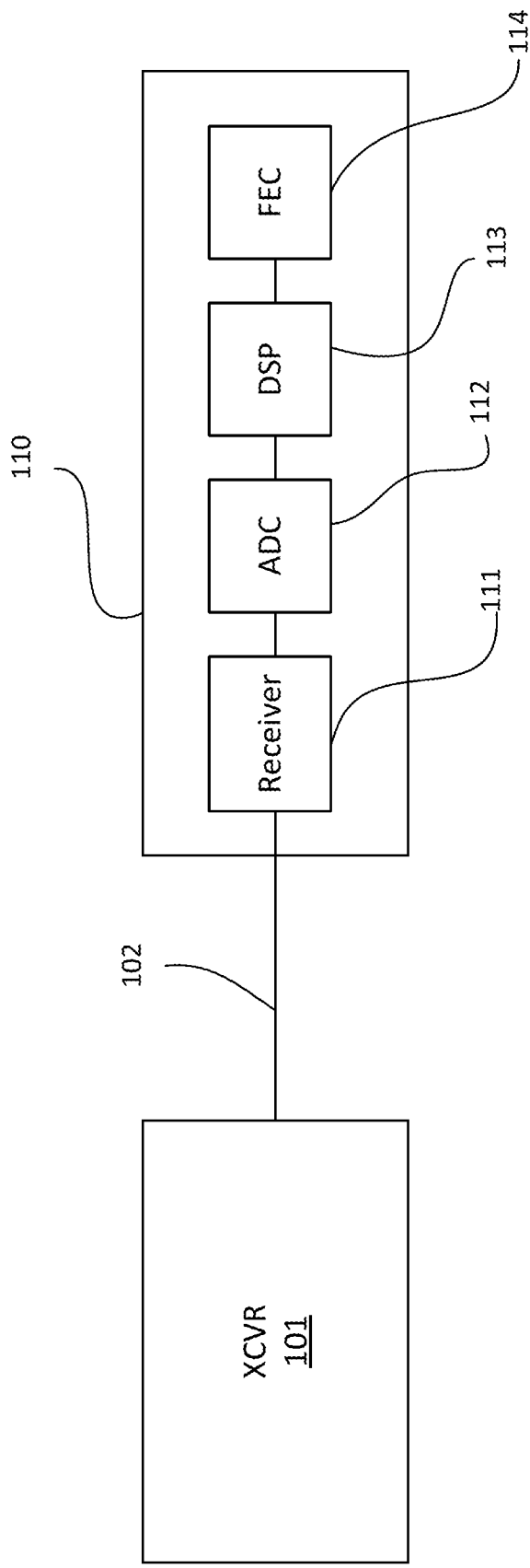
FIG. 1 is a simplified diagram illustrating a communication system.

The present invention is directed to data communication systems and methods thereof. According to various embodiments, the present invention provides a communication with a reconfigurable forward-error-correction (FEC) module. The FEC module processes data received from two or more communication lanes, and depending on the mode of operation, the FEC module can combine data from the two or more communication lanes and perform error correction on the combined data, or the FEC module can processes data from the two communications lanes separately and perform error correction independently for the each of the data communication lanes. There are other embodiments as well.

As explained above, improved communication systems and methods are desired. For example, to move a large amount of data, error correction devices and mechanisms are essential aspects of communication systems. Forward-error-correction (FEC) mechanism has been used in many communication systems and applications thereof. Among other things, FEC provides the capability of both detecting and correcting errors that are in data transmitted through a communication network. There have been various types of FEC mechanisms in the past. It is to be appreciated that the embodiments of the present invention provide a reconfigurable FEC device and method thereof.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

FIG. 1 is a simplified diagram illustrating a communication system. A physical link 102 is provided between transceiver 101 and transceiver 110. For example, the physical link 102 may be an optical communication line, or other types of physical channel, configured between transceivers 101 and 110. The signals transmitted through the physical link 102 are encoded for transmission as analog signals. For example, the receiver 111 of transceiver 110 provides a physical receiving interface for processing analog signals transmitted through the physical link 102. For optical signals, optical amplifiers and other components may be needed to convert optical signal to electrical signal, and vice versa. Analog signals received by the receiver 111 is then processed by the analog to digital converter (ADC) 112. The ADC 112 coverts analog signals to digital signals that can be later decoded. The digital signal processor (DSP) 113 and the forward error correction (FEC) module 114 are configured to decode the digital signals and perform error correction. Among other things, the FEC module is used to decrease BER (Bit Error Rate) of the communication system. Through components as shown in FIG. 1, data coming from the transceiver 101 is processed and ready to be used. For various types of PAM communication architectures, more than one communication lanes may be used to provide a high data throughput. As the rate of transferring data stream is limited by the physical links, a data stream is split across multiple communication lanes or channels.

Figure 2:
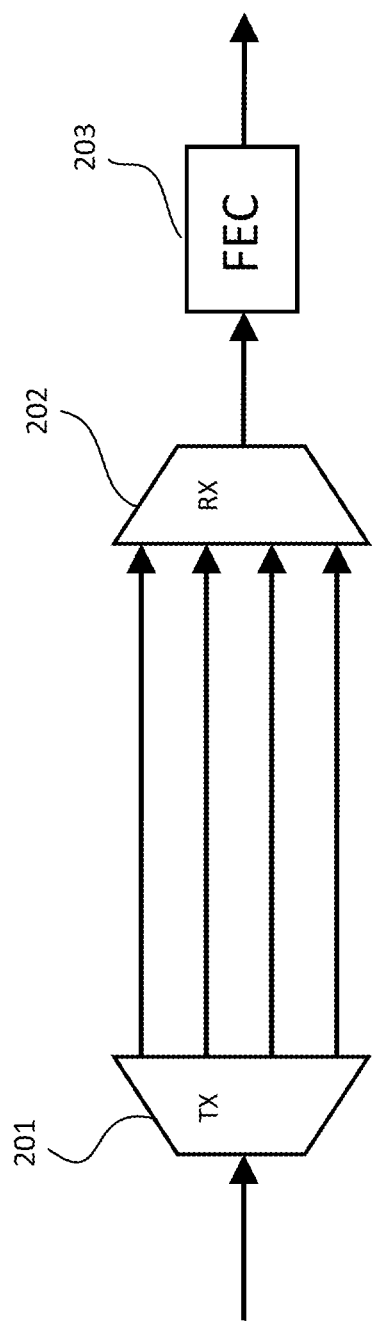
FIG. 2 is a simplified diagram illustrating a communication system operating in full-speed mode.

FIG. 2 is a simplified diagram illustrating a communication system operating in full-speed mode. As shown in FIG. 2, four data communication lanes are provided between the transmitting module 201 and the receiving module 202. For example, to decrease latency over the communication system, a FEC code word is split and sent over multiple communication lanes. The code word is reconstructed in the receiving module 202 and decoded by the FEC module 203. An accumulator may be used to buffer and align data received from the multiple communication lanes. For example, the four data communication lanes each carries a quarter of the FEC code word, and a data rate of 100 Gbps is achieved using PAM communication protocol, where each lane is characterized by a data rate of 25 Gbps. Depending on the data communication rate, other configurations are possible as well, such as half-speed mode.

Figure 3:
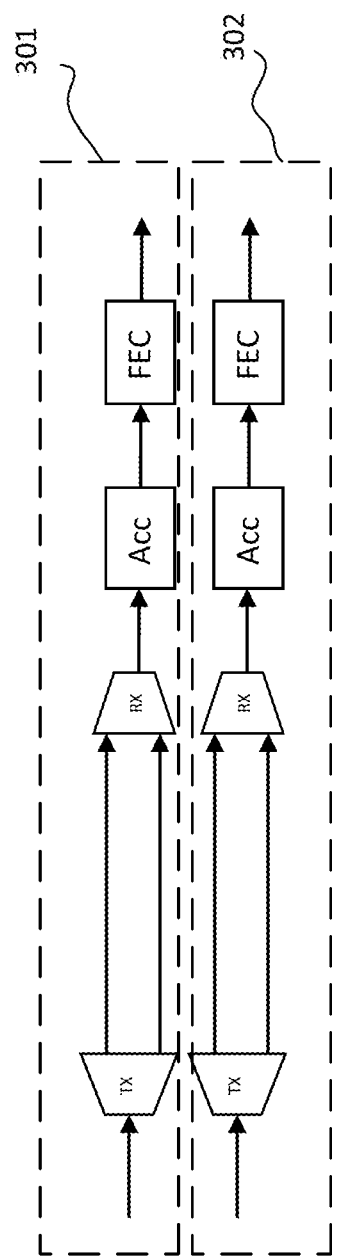
FIG. 3 is a simplified diagram illustrating a communication system operating in half-speed mode.

FIG. 3 is a simplified diagram illustrating a communication system operating in half-speed mode. For example, in half-speed mode, two lanes are used transmit a FEC code word that is split into two data streams. Once processed by the receiver, an accumulator is used to align the code word, and the aligned code word is processed by the FEC. Operating in half-speed mode, communication links 301 and 302 each operates at the half of the data rate as the communication system illustrated in FIG. 2. However, by having two communication links, it is possible to provide two separate data streams operating at a lowered data rate. And for communication system in FIG. 3 to work, two sets of accumulators and FEC modules are needed, as one is need for each communication link. For example, in a PAM based communication system, each of the communication links 301 and 302 operates at a data rate of 80 Gbps, and each communication lane transfers data at a rate of 40 Gbps. In addition to configurations illustrated in FIGS. 2 and 3, a communication system may operate in an independent data mode.

Figure 4:
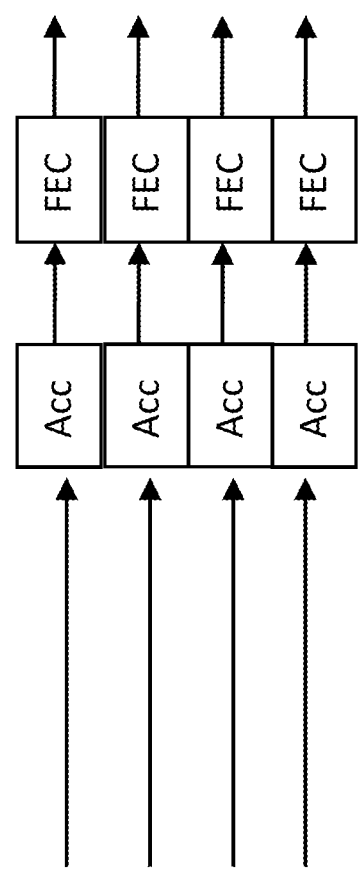
FIG. 4 is a simplified diagram illustrating a communication system operating in full-speed and independent data mode.

FIG. 4 is a simplified diagram illustrating a communication system operating in full-speed and independent data mode. As shown in FIG. 4, communication links are independent from one another, and each of the communication links comprises a communication lane, an accumulator, and an FEC module. A benefit of the communication system operating in independent data mode is that each communication link is independent and thus communication links can be used by different entities or applications. Unfortunately, to operate in the independent mode with four communication links, four FEC modules are needed. FEC modules, as described below, are typically expensive, both in terms of area and power, to implement, as complex computations are performed. To be able to operate in full modes, half-mode, and independent mode as respectively illustrates in FIGS. 2, 3, and 4, conventional systems typically require multiple FEC modules to provide these configuration. It is to be appreciated that embodiments of the present invention offer multiple operating modes, where the FEC module in a communication is reconfigurable and works with different modes of operation, thereby eliminating the needs for redundancy. Details descriptions of FEC modules and systems thereof are explained in more details below.

Figure 5:
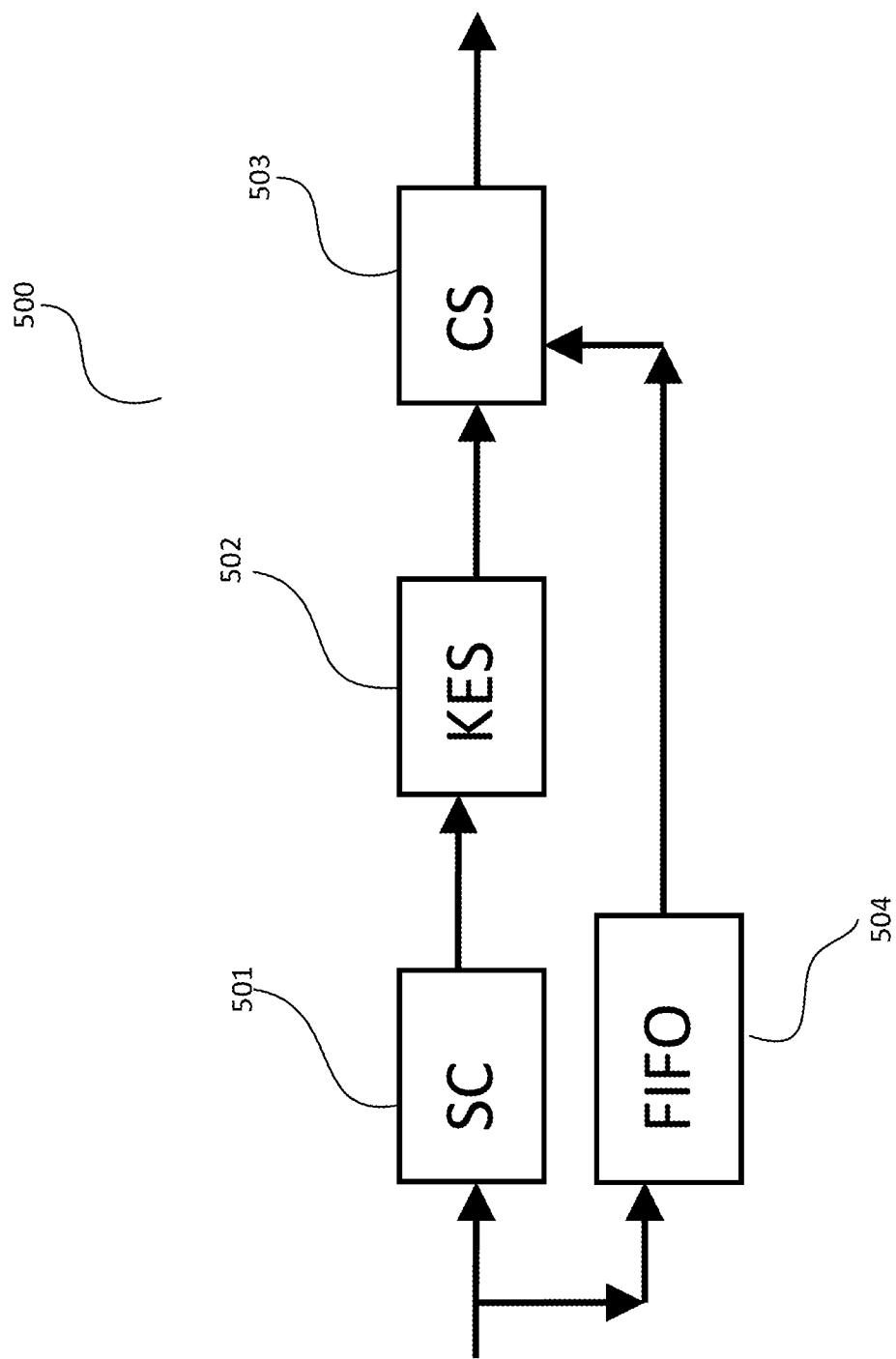
FIG. 5 is a simplified diagram illustrating an FEC according to an embodiment of the present invention.

FIG. 5 is a simplified diagram illustrating an FEC module 500 according to an embodiment of the present invention. This diagram is merely an example, which should not unduly limit the scope of the claims. One of ordinary skill in the art would recognize many variations, alternatives, and modifications. As shown in FIG. 5, an FEC module 500 includes a syndrome computation (SC) module 501, a key equation solver (KES) module 502, a Chien search (CS) module 503, and first-in-first-out (FIFO) module 504. For example, the FEC module 500 in FIG. 5 is capable of processing Bose-Chaudhuri-Hocquenghem (BCH) and Reed Solomon codes. Among other things, the FEC module 500 uses a number of parity symbols to perform error correction. The SC module 501 is configured to compute syndrome polynomials a code words. The syndrome polynomials are used to generate an equations, which is to be solved by the KES module 502. For example, the KES module 502 provides two polynomials for determining the location and value of the errors the received code word. Depending on the implementation, the KES module may use Berlekamp Massey (BM), Euclidean, and/or other types of algorithms for solving key equations. In a specific embodiment, dual-line architecture of BM algorithm is used. The CS module 503 determines error location(s). Depending on the implementation, Forney algorithm may be used to determine the value of the detected errors. The FIFO module 504 stores the received code word, which is corrected (as needed) by the CS module 503. In various embodiments, data coming into the FEC module 500 is split into four parts, and can be processed as a single 160-bit bus, two independent 80-bit buses, or four 40-bit buses, thereby supporting the full mode, half-mode, and independent mode described above.

It is to be appreciated that the FEC module 500 may include additional components as well. In various embodiments, the FEC module 500 additionally includes a Forney module (not shown in FIG. 5) that computes values and locations of errors. For example, the Forney module uses data from CS module and performs division calculation for determining error values and locations.

Figure 6:
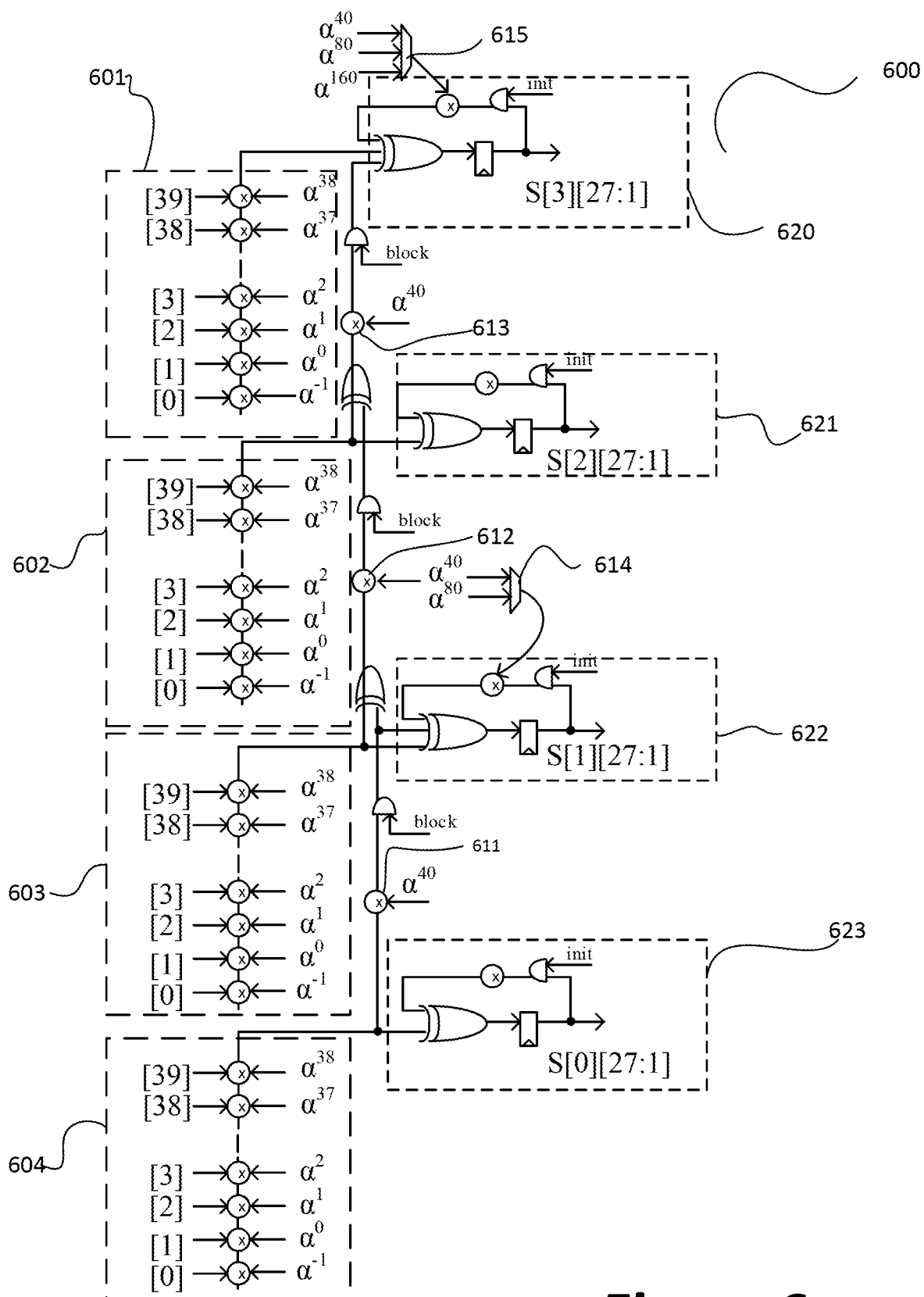
FIG. 6 is a simplified diagram illustrating syndrome search module according to an embodiment of the present invention.

FIG. 6 is a simplified diagram illustrating syndrome computation module 600 according to an embodiment of the present invention. This diagram is merely an example, which should not unduly limit the scope of the claims. One of ordinary skill in the art would recognize many variations, alternatives, and modifications. For example, the syndrome computation (SC) module 600 can be used in the FEC module 500. In various embodiments, the SC module 600 provides RS decoding capability that is compatible with FEC standard in accordance to IEEE 802.15.3c. The SC module 600 uses RS code scheme to calculate root values. For example, a typical RS code word consists of n bits, which include k data bits and 2t parity bits, and the system is capable of correcting up to t bits of errors. As an example, an RS (255, 239) code is 255-bit long, which includes 239 bits of data and 16 bits of parity, where t=8 (thus capable to correct 8 symbols of errors as explained above).

During the RS decoding process, 2t syndrome coefficients are needed to provide up to t symbols of error correction. For example, in a syndrome calculation, coefficients $s_i$, with i=1, 2, ... 2t are computing using Equation 1 below:

$$s_i = \Sigma_{j=0}^{N-1} r_j (\alpha^i)^j \qquad \text{Equation 1}$$

In Equation 1, $r_j$ refers to N received symbols, and $\alpha$ is a root of the primitive polynomial. As can be seen that according to Equation 1, syndrome calculation involves many iterations of multiple, addition, and root calculations, and thus is computationally complex. To reduce computational complexity, Homer's rule is sometimes used to perform syndrome calculations recursively. For example, in a syndrome computation cell, a received symbol, which is typically provided in a form of a bit vector, is multiplied and added for calculating coefficients.

To use the FIG. 2 system as an example, if each of the four data communication lanes is carrying 40-bits, once the receiving module 202 processes the four data communication lanes, a 160-bit wide data is provided to the FEC module 203. For the purpose of syndrome calculation, a 160-bit wide vector is provided for calculating syndrome polynomials. In contrast, the system in FIG. 3 separates data communication lanes into 2 group, each using two data communication lanes. As an example, each group of two data communication lanes provides 80-bits (e.g., combining two 40-bit lanes) to its respective FEC module, and an 80-bit wide vector is provided for calculating syndrome polynomials. Similarly, the communication system shown in FIG. 4 utilizes four communication, each having its own FEC module for decoding symbols; each of the four communication lane is characterized by a width of 40-bits, and a 40-bit wide vector is used for by each of the FEC module.

Depending on how the communication systems are set up (e.g., how the communication lanes are grouped), the corresponding FEC modules may use a 40-bit vector, an 80-bit vector, a 160-bit vector, or vectors of other sizes. The FEC modules, depending on the size and structure of the vectors, perform computations (i.e., syndrome calculation, key equation solving, and Chien search process) that are specifically based on the vector size. However, conventional systems described above use FEC modules are can only process a single size of vector; for example, the FEC module that is configured to process a 40-bit vector cannot process an 80-bit or 160-bit vector. Thus, for different configurations of the communication system, different vector modules and processing modules (i.e., for both SC module and CS module of the FEC module) thereof need to be used. It is to be appreciated that the SC module 600 in FIG. 6 is configured to process incoming data of 40-bit wide, 80-bit wide, or 160-bit wide. It is to be appreciated that the SC module 600 is provided as an example that is capable of operating in 40-bit, 80-bit, and 160-bit modes, which is a part of a reconfigurable FEC. Depending on the implementation, other configurations are possible as well. For example, SC modules according to embodiments of the present invention can be configured many different modes. As an example, an SC module according to an embodiment of the present invention can operate in 80-bit, 160-bit, and 320-bit modes. As another example, an SC module according to an embodiment of the present invention can operate in 40-bit, 80-bit, 160-bit, and 320-bit modes. As yet another example, an SC module according to an embodiment of the present invention can operate in 64-bit, 128-bit, and 258-bit modes. It is to be appreciated that embodiments of the present invention can be implemented in many other multi-mode configurations as well.

The SC module 600 includes four vector modules 601-604. Each of the vector modules is 40-bit wide. For example, the vector module 604 includes a vector that is 40-bit wide, storing bits vector bits R[0] to R[39]. The vector module 601 also comprises 40 multipliers that multiplies input vector bits and corresponding root values. More specifically, a vector bit R[n] is multiplied with root value $\alpha^{n-1}$, which is based on Equation 1 described above. For example, R[0] multiplies with $\alpha^{-1}$, R[1] multiplies with $\alpha^0$, R[2] multiplies with $\alpha^1$, and so on and so forth. Vector module 601, 602, and 603 are configured similar to the vector module 604, where bits of a 40-bit vector are multiplied respectively with corresponding root values.

Each of vector modules 601-604 corresponds to a processing module. As shown in FIG. 6, the vector module 604 corresponds to the processing module 623, which performs syndrome calculation. For example, syndrome calculation involves, among other things, initializing calculation and adding syndrome polynomials, which are in accordance to Equation and the process described. Depending on the implementation, syndrome calculation can be using serial computation or parallel computation. Similarly, vector module 603 corresponds to the processing module 622; vector module 602 corresponds to the processing module 621; vector module 601 corresponds to the processing module 620.

The vector modules 601-604 and their corresponding processing modules are configured to operate in different modes. As an example, to operate in the independent mode described above, the vector modules and their corresponding processing modules operate independently from one another. For example, the vector module 603 and its processing module 622 may work together as an independent SC module that calculates performing syndrome calculation for a 40-bit vector, ignoring input from the multiplier 611, which is based on the vector module 604. The selector module 614 as shown selects between $\alpha^{40}$ and $\alpha^{80}$, depending on whether the SC module 600 operate in 40-bit mode, 80-bit mode, or 160-bit mode. For example, the selector module 614 comprises an MUX. If the SC module 600 is operating in an 80-bit mode, the processing module 622 uses the input from the multiplier 611 and $\alpha^{80}$ as an input to calculate syndrome polynomials up to $\alpha^{80}$ and R[79], where R[79] comes from vector modules 603 and 604. If the SC module 600 is operating in a 160-bit mode (i.e., data combined from four data communication lanes), the vector module 603 and its processing module 622 provides its output at multiplier 612 to the vector module 601 and its corresponding processing module 620.

The vector module 601 and its corresponding processing module 620 are configured to operates in 40-bit mode, 80-bit mode, or 160-bit mode. Operating in 40-bit mode, the vector module 601 and processing 620 ignore inputs from other vector modules and their corresponding processing modules; the selector module 615 selects $\alpha^{40}$ as the input to the processing module 620. Operating in 80-bit mode, the processing module 620 uses vector data from vector modules 601 and 602, and selects value $\alpha^{80}$ as its input for calculating the syndrome polynomials. Operating in a 160-bit mode, the processing module 620 uses vector data from all for vector modules 601-604, and selects value $\alpha^{160}$ as its input for calculating the syndrome polynomials. In various implementations, when operating in 80-bit mode, the processing module 620 uses data from vector modules 601 and 602 as the input to perform syndrome calculation, and the processing module 622 uses data from vector modules 603 and 604 as the input to perform syndrome calculation. As mentioned above, depending on the specific implementations, vector modules and corresponding processing modules can be added or removed. In various configurations, a syndrome search module according to embodiments of the present invention may have 2, 4, 8, 16, or other numbers of vector module and corresponding processing module sets, which are used respectively for 2, 4, 8, 16, or other numbers of communication lanes in a communication system.

Figure 7:
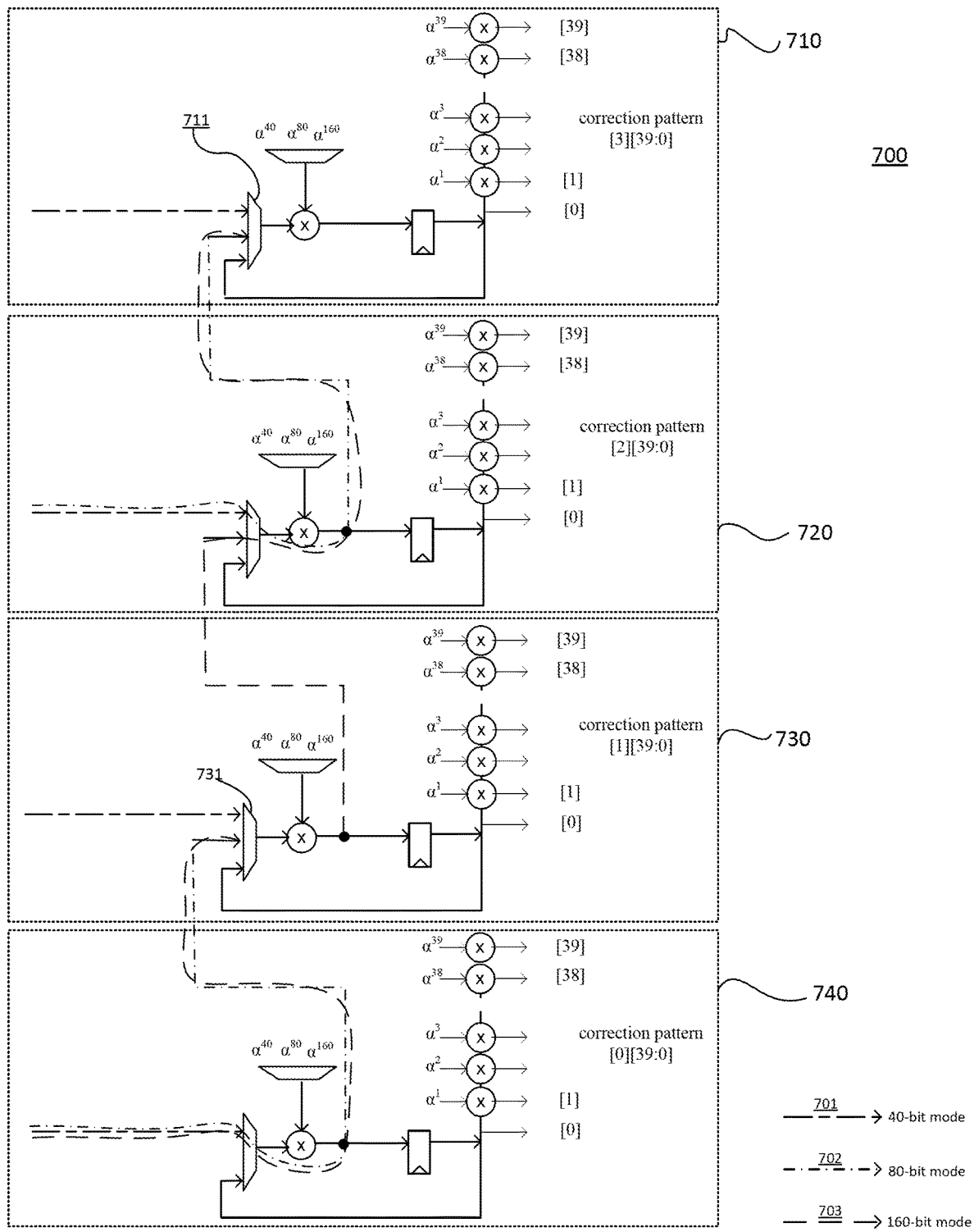
FIG. 7 is a simplified diagram illustrating Chien search module according to an embodiment of the present invention.

Similar to the SC module, the CS module comprises vectors and corresponding correction modules that can be configured to operate in different modes (e.g., 4 lanes, 2 lanes, and independent modes). FIG. 7 is a simplified diagram illustrating a Chien search (CS) module 700 according to an embodiment of the present invention. This diagram is merely an example, which should not unduly limit the scope of the claims. One of ordinary skill in the art would recognize many variations, alternatives, and modifications. As explained above, a CS module is used to determine error location(s). The CS module 700 in FIG. 7A comprises sections 710, 720, 730, and 740. The four sections each comprises an error correction module that is configured to determine errors and output a 40-bit vector. For example, when operating independently, each of the sections provides a correction pattern of 40 bits (i.e., [39:0]). Similar to the SC module described in FIG. 6, the CS module 700 is configured to process data that is 40-bit wide, 80-bit wide, or 160-bit wide. It is to be understood that depending on the specific implementation, the CS modules according to embodiments of the present invention can operate in other modes (e.g., 16-bit, 32-bit, 320-bit, etc.) as well.

When the CS module 700 operates in 80-bit mode, the four sections 710, 720, 730, and 740 are grouped into two sets, where each set processes 80 bits. To process 80-bit wide data stream, sections 710 and 720 are grouped together as a set, and sections 730 and 740 are grouped together as another set. For example, when operating in 80-bit mode, sections 710 and 720 share their vectors. More specifically, among the 80 bits, section 720 provides vector [39:0] and section 710 provides vector [79:40]. Similarly, in 80-bit mode, section 730 provides vector [39:0] and section 740 provides vector [79:40]. As shown in FIG. 7, the data path 702 operates in 80-bit mode, and it is configured to provide a data connection between sections 710 and 720, and between 730 and 740. Section 730 comprises a selector 731, which receives both 40-bit data path 701 and 80-bit data path 702. Depending on the mode of the option, the selector 731 chooses whether to use the data from the 80-bit data path 702. Similarly, the selector 711 of the section 710 chooses whether to use data from the data path 702 (80-bit mode) and/or data path 703 (160-bit mode).

When the CS module 700 operate in 160-bit mode, the four sections 710, 720, 730, and 740 share their vectors and operate as a single 160-bit unit. The four sections are connected by the data path 703 as shown. Section 740 provides vector [39:0], section 730 provides vector [79:40], section 720 provides vector [119:80], and section 710 provides vector [159:120]. The selector 711, when operating in 160 mode, selects data path 703. Depending on the mode of operation, section 710 may perform error detections for 40-bit, 80-bit, or 160-bit data.

It is to be understood that CS module 700 can be implemented in various ways. With the use of data paths as illustrated in FIG. 7, the process of error detection and correction can be performed by different types of Chien-search architectures. For example, the CS module 700 may include additional sections if more than four sections are required (e.g., operating in 8 lane modes). The CS module 700 may have fewer sections as well (e.g., operating in 2-lane and independent mode). Additionally, the size of the vectors at the CS module 700 may be modified according to specific implementations.

In various embodiments, communication systems according to embodiments of the present invention include a controller module that coordinate the operation the FEC. For example, depending on the mode of operation (e.g., 40-bit, 80-bit, 160-bit), the controller module indicates how SC module and SC module process data and what data path is to be used. There are other embodiments as well.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A forward-error correction (FEC) device with multiple operating modes for processing data from at least a first communication lane and a second communication lane operating at n-bit, n being associated with a data width, the FEC device comprising:
a syndrome computation (SC) module configured to perform syndrome computation (SC) using a first processing module to generate an equation using a 2n-bit vector if the operating mode is in a 2n-bit mode, the 2n-bit vector including data from the first communication lane and the second communication lane, the 2n-bit vector being stored in a first vector module and a second vector module, the SC module further being configured to perform syndrome computation (SC) using a second processing module to generate the equation using a first n-bit vector if the operating mode is in a n-bit mode, the first n-bit vector including data from the first communication lane, the n-bit vector being stored in the first vector module;
a key equation solver (KES) module coupled to the SC module and configured to generate a first polynomial and a second polynomial based at least on the equation; and
a Chien Search (CS) being operational in multiple operating modes and configured to use at least the first polynomial to determine an error location.

2. The device of claim 1 further comprising an accumulator for aligning data at least from the first communication lane.

3. The device of claim 1 wherein the operating mode is selected from the n-bit mode, the 2n-bit mode, and a 4n-bit mode.

4. The device of claim 1 further comprising a buffer module.

5. The device of claim 4 wherein the buffer module comprises a first-in-first-out (FIFO) buffer.

6. The device of claim 1 further comprising a Forney module coupled to the CS module for determining error locations.

7. The device of claim 1 wherein the SC module is configured to perform serial computations.

8. The device of claim 1 wherein the SC module is configured to perform parallel computations.

9. The device of claim 1 wherein the first polynomial is associated with the error location and the second polynomial is associated with an error value.

10. The device of claim 9 wherein the first communication lane is configured to transmit pulse-amplitude modulation (PAM) signals.

11. The device of claim 1 wherein n equals to 40.

12. The device of claim 1 wherein the first processing module further comprises a selector module for selecting from two or more root values.

13. The device of claim 1 wherein the CS module comprises a first section and a second section corresponding to the multiple operational modes.

14. The device of claim 1 wherein the first section is configured to operate in the n-bit mode and the 2n-bit mode for determining errors.

15. The device of claim 1 wherein the SC module is further configured to generate the equation using a 4n-bit vector if operating mode is in a 4n-bit mode.

16. The device of claim 1 wherein the FEC device is configured to use a number of parity symbols for error correction.

17. A forward-error correction (FEC) device with multiple operating modes for processing data from at least a first communication lane and a second communication lane operating at n-bit, n being associated with a data width, the FEC device comprising:

a syndrome computation (SC) module, the SC module comprising a plurality of processing modules, the plurality of processing modules including a first processing module and a second processing module, the first processing module being configured to operate in an n-bit mode and a 2n-bit mode for calculating syndrome polynomials for at least a first equation, the first processing module performing syndrome calculation using an n-bit vector based on data received from the first communication lane when operating in the n-bit mode, the first processing module performing syndrome calculation using a 2n-bit vector based on data received from the first communication lane and the second communication lane when operating in the 2n-bit mode, a key equation solver (KES) module coupled to the SC module, the KES module being configured to generate at least a first polynomial and a second polynomial based using at least the first equation;

a Chien search (CS) module coupled to the KES module, the CS module comprising a plurality of sections, the plurality of sections including a first section and a second section, the first section being configured to operate in the n-bit mode and the 2n-bit mode for determining errors; and a first-in-first-out (FIFO) buffer.

18. The device of claim 17 wherein the multiple operating mode includes a 4n-bit mode.

19. The device of claim 17 wherein the data comprise pulse-amplitude modulation (PAM) data.

20. A method for data communication, the method comprising:

receiving data from a plurality of communication lanes, the plurality of communication lanes including a first communication lane and a second communication lane, the first communication lane and the second communication lane operating at n-bit, n being associated with a data width;

aligning the data using at least an accumulator;

storing the data at a buffer;

determining an operating mode associated with the data;

performing syndrome computation (SC) to generate an equation using a 4n-bit vector if the operating mode is in a 4n-bit mode, the 4n-bit vector including data at least from the first communication lane and the second communication lane, the SC computation being performed by a second processing module;

performing syndrome computation (SC) using a first processing module to generate the equation using a first n-bit vector if the operating mode is in an n-bit mode, the first n-bit vector including data from the first communication lane, the n-bit vector being stored in the first vector module;

solving the equation using a key equation solver (KES) module;

generating a first polynomial and a second polynomial based at least on the equation; and performing a Chien Search (CS) using at least the first polynomial to determine an error location.

\* \* \* \* \*